United States Patent [19]

Tamamizu et al.

[11] Patent Number: 4,771,021

[45] Date of Patent: Sep. 13, 1988

[54] SEMI-CONDUCTOR DIFFUSION FURNACE COMPONENTS

[76] Inventors: Teruyasu Tamamizu; Yukifumi Sakai; Hiroshi Tashiro, all of c/o Research and Development Center, Toshiba Ceramics Co., Ltd., 30 Soya, Hadano-shi, Kanagawa-ken, Japan

[21] Appl. No.: 877,918

[22] Filed: Jun. 24, 1986

[30] Foreign Application Priority Data

Jul. 1, 1985 [JP] Japan .................................. 60-142498
Jul. 9, 1985 [JP] Japan .................................. 60-149347

[51] Int. Cl.$^4$ ............................................. C04B 35/54
[52] U.S. Cl. ......................................... 501/90; 501/88
[58] Field of Search ..................................... 501/88, 90

[56] References Cited

U.S. PATENT DOCUMENTS 3,951,587  4/1976  Alliegro et al. ...................... 501/88

FOREIGN PATENT DOCUMENTS

| | | | |
|---|---|---|---|
| 1158259 | 6/1983 | Canada .................................. | 501/88 |
| 3116786 | 11/1982 | Fed. Rep. of Germany ........ | 501/88 |
| 0076313 | 6/1977 | Japan .................................... | 501/90 |
| 0144404 | 12/1978 | Japan .................................... | 501/90 |
| 0021410 | 2/1979 | Japan .................................... | 501/90 |
| 0088078 | 6/1982 | Japan .................................... | 501/88 |
| 0145075 | 9/1982 | Japan .................................... | 501/88 |
| 3446891 | 7/1985 | Japan .................................... | 501/88 |
| 0246264 | 12/1985 | Japan .................................... | 501/88 |

Primary Examiner—William R. Dixon, Jr.
Assistant Examiner—James M. Hunter, Jr.
Attorney, Agent, or Firm—Wegner & Bretschneider

[57] ABSTRACT

A component for a semi-conductor diffusion furnace includes a sintered silicon carbide matrix resulting from sintering of silicon carbide powder. The silicon carbide power consists essentially of silicon carbide having an average particle size of 10-200 microns (preferably 30-170 microns) and is mixed with fine carbon powder and fine silicon powder.

1 Claim, No Drawings

SEMI-CONDUCTOR DIFFUSION FURNACE COMPONENTS

BACKGROUND OF THE INVENTION

This invention relates to components for a semi-conductor diffusion furnace.

U.S. Pat. No. 3,951,587 discloses semi-conductor diffusion furnace components such as a process tube, paddle and boat consisting essentially of a sintered silicon carbide matrix resulting from the sintering of silicon carbide powder which is made up of approximately 50% by weight of fine silicon carbide having an average particle size of 0.1-8 microns and 50% by weight of coarse silicon carbide having an average particle size of 30-170 microns.

It is described in U.S. Pat. No. 3,951,587 that original silicon carbide powder may be all fine or all coarse or any mixture thereof other than the preferred 50% 0.1 to 8 microns and 50% 30 to 170 micron combination. However, if for example the powder is all of the finer size, then the sintered structure may lack sufficient continuous porosity to permit complete impregnation of the silicon carbide matrix with silicon. The silicon would essentially only impregnate the surface pores or irregularities so that only partial impregnation would occur. On the other hand if the silicon carbide powder is substantially coarser, the porosity would be more than adequate in size, as would be the degree of continuity between the pores, but the sintered structure would have lower mechanical strength properties than when the bimodal approach is employed. Accordingly, the bimodal approach is advantageous.

However, it is very difficult to reduce in size the silicon carbide powder, for example, by grinding or milling, because silicon carbide is extremely hard.

Also, fine silicon carbide powder has very large surface area as a whole because the average particle size thereof is 0.1-8 microns. When the coarse silicon carbide is ground into the fine silicon carbide, impurities are apt to be mixed therewith.

In order to avoid such impurities, a special process is additionally required, which increases production costs.

SUMMARY OF THE INVENTION

The object of this invention is to provide a semi-conductor diffusion furnace component which has excellent physical properties and can be easily manufactured.

In semi-conductor diffusion furnace components according to this invention, only coarse silicon carbide powder having an average particle size of 10-200 microns (preferably 30-170 microns) is used. Such coarse silicon carbide powder is mixed with fine carbon powder and fine silicon powder in place of fine silicon carbide. It may be impregnated with silicon. In this case, no fine silicon powder is used.

For example, it is preferable that the coarse silicon carbide powder 50-90 parts by weight is mixed with 3-15 parts by weight of carbon powder having an average particle size of 0.1-8 microns and 7-35 parts by weight of silicon powder having an average particle size of 0.1-8 microns.

In this mode of this invention, if the carbon powder is less than 3 parts by weight, the bonding power of silicon carbide is relatively small so that the strength of the component is decreased. If the carbon powder is larger than 15 parts by weight, the component is sometimes deformed prior to impregnation of the silicon powder so that the strength of the component is decreased. If the silicon powder is less than 7 parts by weight, the bonding power of silicon carbide is relatively small so as to decrease the strength of the component. If the silicon powder is larger than 35 parts by weight, it is difficult to impregnate the silicon powder so that a homogeneous material cannot be easily obtained. If the total of the carbon powder and the silicon powder is too much, then the volume of the component is decreased during the sintering process thereof so that a deformation problem is apt to occur.

A process for manufacturing such semi-conductor diffusion furnace components will be explained. Coarse silicon carbide powder, fine carbon powder and fine silicon powder are blended with an organic binder such as alcohol or phenol resin thereby to produce a starting mixture. It is granulated so as to become pellets. They are performed in the shape of a desired component such as a process tube by means of a rubber press thereby to obtain a formed body. It is presintered at a temperature of 800°-1200° C. thereby to produce a presintered body. The presintered body is impregnated with silicon and substantially simultaneously sintered at a temperature of 1500°-1800° C. After impregnation with silicon, the porosity of the component is less than 1%.

Prior to the impregnating step, the presintered body is preferably purged by chlorine gas so as to be purified whereby a high quality of component can be obtained.

Also, it is preferable that the coarse silicon carbide powder 85-97 parts by weight is mixed with 3-15 parts by weight of carbon powder having an average particle size of 0.1-8 microns. No fine silicon powder is used. A sintered body is impregnated with silicon.

In this mode of this invention, if the carbon powder is less than 3 parts by weight, the bonding power of silicon carbide is relatively small so that the strength of the component is decreased. If the carbon powder is larger than 15 parts by weight, the strength of the component is decreased. The silicon 10-25 parts by weight is preferably included in case of the carbon powder 3-15 parts by weight.

A process for manufacturing such semi-conductor diffusion furnace components will be stated as follows: Coarse silicon carbide powder and fine carbon powder are blended with an organic binder such as alcohol or phenol resin thereby to produce a starting mixture. It is granulated so as to become pellets. They are preformed in the shape of a desired component such as a process tube by means of a rubber press thereby to obtain a formed body. After it is presintered at a temperature of 800°-1200° C., the presintered body is impregnated with silicon for the silicidation purpose and substantially simultaneously sintered at a temperature of 1500°-1800° C. Pior to the impregnating step, the presintered body is preferably purged by chlorine gas so as to be purified whereby a high quality of component can be obtained.

According to this invention, as no fine silicon carbide powder is used, a semi-conductor diffusion furnace component can be easily manufactured without any impurities. Fine carbon powder and/or fine silicon powder which are used in place of conventional fine silicon carbide powder can be easily produced in size as compared with the fine silicon carbide powder. Thus, production costs can be decreased. Also, contamination of impurities can be facilitated.

EXAMPLE 1

A process tube for a semi-conductor diffusion furnace is manufactured as follows:

A mixture is prepared from the following combination of materials:
(a) silicon carbide powder having an average particle size of 30-170 microns . . . 70 parts by weight;
(b) carbon powder having an average particle size of 0.1-8 microns . . . 9 parts by weight;
(c) silicon powder having an average particle size of 0.1-8 microns . . . 21 parts by weight; and
(d) alcohol . . . 10 parts by weight.

The mixture is mixed or blended and thereafter granulated thereby to produce pellets in a well-known manner. After such pellets are dried, they are formed in the shape of a process tube by means of a conventional rubber press thereby to produce a formed body. It is presintered at a temperature of 1,200° C. thereby to obtain a presintered body, and then it is purged at a temperature of 1,000° C. by means of chlorine gas and a small amount of water vapor so as to be purified. Such a presintered and purified body is pregnated with silicon at 1,700° C. for the purpose of silicidation. At the same time, it is sintered at 1,700° C. thereby to obtain a sintered body. If desired, it is finally finished by grinding a surface thereof.

The physical properties of the process tube are as follows:

Bulk Density . . . 3.08
Strength . . . 250 MPa

EXAMPLE 2

A further process tube for a diffusion furnace is manufactured as follows:

A mixture is prepared from the following combination of materials:

(a) silicon carbide powder having an average particle size of 10-200 microns . . . 90 parts by weight;
(b) carbon powder having an average particle size of 0.1-8 microns . . . 9 parts by weight; and
(c) phenol resin . . . 10 parts by weight.

The mixture is blended and thereafter granulated thereby to produce pellets in a well-known manner. After such pellets are dried, they are formed in the shape of a process tube by means of a conventional rubber press thereby to produce a formed body. After that, it is presintered at a temperature of 1,200° C. thereby to obtain a presintered body, and then it is purged at a temperature of 1,000° C. by means of chlorine gass and a small amount of water vapor so as to be purified. Such a presintered and purified body is pregnated with silicon at 1,700° C. Simultaneously it is sintered at 1,700° C. so as to produce a sintered body. It is finally finished by grinding a surface thereof.

The physical properties of the process tube are as follows:

Bulk Density . . . 2.9
Strength . . . 190 MPa

What is claimed is:

1. A component for a semi-conductor diffusion furnace comprising a sintered silicon carbide matrix resulting from presintering a formed body consisting essentially of
   (a) 50 to 90 parts by weight of silicon carbide powder having an average particle size of 30 to 170 $\mu$m,
   (b) 3 to 15 parts by weight of carbon powder having an average particle size of 0.1 to 8 $\mu$m, and
   (c) 7 to 35 parts by weight of silicon powder having an average particle size of 0.1 to 8 $\mu$m; and
   impregnating with silicon and sintering, whereby the resulting silicon carbide matrix has a porosity of less than 1%.

* * * * *